United States Patent
Chen et al.

(10) Patent No.: US 6,421,275 B1
(45) Date of Patent: Jul. 16, 2002

(54) METHOD FOR ADJUSTING A REFERENCE CURRENT OF A FLASH NITRIDE READ ONLY MEMORY (NROM) AND DEVICE THEREOF

(75) Inventors: Han-Sung Chen; Nai-Ping Kuo, both of Hsin-Chu; Kuo-Yu Liao, Pan-Chiao; Chun-Hsiung Hung, Hsin-Chu, all of (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/683,577

(22) Filed: Jan. 22, 2002

(51) Int. Cl.[7] ............................................... G11C 16/28
(52) U.S. Cl. .............................. 365/185.2; 365/185.33; 365/185.24
(58) Field of Search ........................ 365/185.2, 185.33, 365/185.21, 185.24

(56) References Cited

U.S. PATENT DOCUMENTS

| | | | | |
|---|---|---|---|---|
| 6,038,169 A | * | 3/2000 | Ogura et al. ............ | 365/185.11 |
| 6,201,737 B1 | * | 3/2001 | Hollmer et al. ......... | 365/185.16 |
| 6,222,768 B1 | * | 4/2001 | Hollmer et al. ......... | 365/185.16 |

* cited by examiner

Primary Examiner—Andrew Q. Tran
(74) Attorney, Agent, or Firm—Winston Hsu

(57) ABSTRACT

A reference current is generated by inputting an adjusting current, which is about two or three micro amperes larger than the drain current of the NROM cell having a highest threshold voltage of the flash memory, a reference current with an initial value, effectively the same as the drain current of the NROM cell with a lowest threshold voltage. The method involves sensing the difference between the reference current decreasing from its initial value, and the adjusting current under a predetermined memory speed.

14 Claims, 3 Drawing Sheets

METHOD FOR ADJUSTING A REFERENCE CURRENT OF A FLASH NITRIDE READ ONLY MEMORY (NROM) AND DEVICE THEREOF

BACKGROUND OF INVENTION

1. Field of the Invention

The present invention relates to a method for adjusting a reference current, and more particularly, to a method for adjusting a reference current of a flash memory which has a plurality of nitride read only memory cells, so that not only bit information stored in the flash memory is read correctly, but the flash memory is operated under a predetermined memory speed.

2. Description of the Prior Art

Flash memories have become more and more popular recently, and especially in the area of portable communication devices. The basic structure of a flash memory is similar to that of a MOSFET, including a gate, a drain, and a source. To be more accurate, the flash memory includes a floating gate and a control gate, as the gate of the MOSFET. Of course, there are some kinds of flash memories with no control gate, such as the nitride read only memory (NROM) that was invented by Saifun Semiconductors Ltd.

Differing from other types of flash memory that use a polysilicon or metal floating gate, a nitride read only memory (NROM) uses an oxide-nitride-oxide (ONO) layer as a charge-trapping medium. Due to a highly-compacted nature of the silicon nitride layer, hot electrons tunneling from the MOS transistor into the silicon nitride layer are trapped to form an unequal concentration distribution.

In general, the flash memory has the functions of reading, writing, and erasing. When injecting electrons to the floating gate of the memory cell or injecting electrons to the ONO layer of the memory cell, a threshold voltage, at a low voltage initially, of the memory cell increases relatively and results in a current from the drain to the source decreasing. This is the writing state of the memory cell. While connecting a negative voltage to the control gate, electrons trapped in the floating gate (or trapped in the ONO layer) are ejected to lower the threshold voltage of the memory cell. This is the erasing state. Regardless of the state of the memory cell is in, it is necessary to operate a reading procedure while the bit information stored in the memory cell is read.

A method for reading bit information stored in the memory cell comprises inputting a reference voltage or inputting a reference current. If it is possible to compare the reference voltage or the reference current with an output voltage or an output current from memory cells of the flash memory respectively, in a predetermined time period, the memory speed of the flash memory may be fixed and defined. The larger the difference between the reference current or the reference voltage and the output current or the output voltage is, the faster for completing reading the bit information stored in the flash memory is, representing a faster memory speed of the flash memory. In general, the value of the reference voltage and the reference current are set as an average of the high threshold voltage and the low threshold voltage and an average of a high drain current corresponding to the low threshold voltage and a low drain current corresponding to the high threshold voltage to ensure differences between the reference voltage and the output voltage or between the reference current and the output current are the same. Thus, all memory cells of the flash memory can be operated under an equal memory speed, leading to a flash memory with a consistent memory speed.

The method according to prior art for adjusting the reference voltage is to increase the value of the threshold voltage step by step by injecting electrons, using the varying threshold voltage as a possible reference voltage and comparing the threshold voltage and the reference voltage. The weakness of the described method is the cost, while adjusting the reference voltage, with expelling of electrons the only way to compensate this kind of situation, resulting in a life cycle of the flash memory shorter than originally expected. Another method for adjusting the reference current, as mentioned in U.S. Pat. No. 6038169, is to take advantage of several reference transistors incorporated with a control transistor for generating different reference currents for reading, writing, and erasing respectively. This method has to generate different reference currents for different situations, so it is not very practical to adopt.

SUMMARY OF INVENTION

It is therefore an object of the present invention to provide a method for generating a reference current for a flash memory. The present invention estimates a value of the reference current and fine-tunes the value of the reference current, and then assures it is possible to read bit information stored in the flash memory in a predetermined time period.

In accordance with the claimed invention, the method comprises inputting a predetermined adjusting current with a value less than that of the initial value of the reference current, lowering the value of the reference current at a predetermined rate, and sensing the difference under the predetermined memory speed between the value of the reference current and the value of the adjusting current according to the output of the sensing cell until it is not possible to sense the difference between the reference current and the adjusting current under a predetermined memory speed.

It is an advantage of the present invention that because the value of the reference current varies during adjustment, that the reference current after adjustment can be used as an index to determine whether the flash memory is capable of being operated under a specific predetermined memory speed or not. If the difference between the output current and the reference current is enough to be sensed in the predetermined time period, there is no doubt the flash memory can be operated under the predetermined memory speed. Even under the condition that the difference between the reference current and the output current is not enough to be sensed, the value of the reference current can be lowered, representing a reduction of the memory speed of the flash memory, until it reaches a level that the difference between the reference current and the output current will be sensed successfully. As a result, the present invention is more flexible than the prior art.

These and other objectives of the present invention will no doubt become obvious to those of ordinary skill in the art after reading the following detailed description of the preferred embodiment which is illustrated in the various figures and drawings.

DETAILED DESCRIPTION

Figure 1:
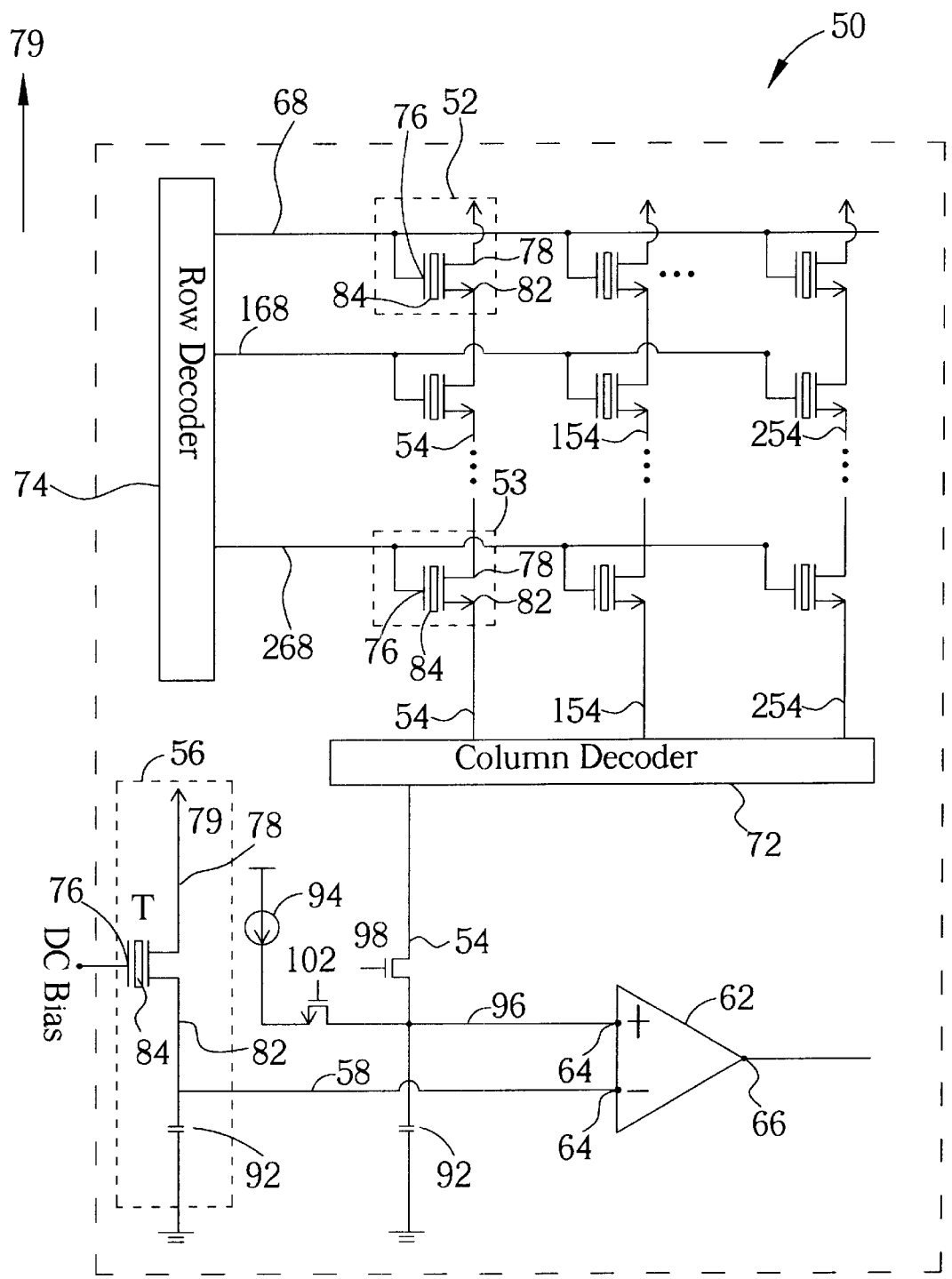
FIG. 1 is a schematic diagram of a portion of a flash memory circuit according to the present invention.

Please refer to FIG. 1 of a schematic diagram of a portion of a flash memory 50 according to the present invention. The flash memory 50 comprises a plurality of nitride read only memory cells (NROM cells) 52, operating under a predetermined memory speed with an output supplied to each of the NROM cells 52 connected with bit lines 54, 154, and 254, a reference cell 56, for outputting a reference current via the reference line 58. The reference current is adjustable and has an initial value. The flash memory 50 further comprises a sensing cell 62, two input ends 64 connected to one of the bit lines 54, 154, and 254, that is chosen for operation, and the reference line 58, for sensing a voltage difference between the bit line 54, 154, or 254, and the reference line 58 on an output end 66 of the sensing cell 62. The sensing cell 62 may be a sensing amplifier.

The flash memory 50 further comprises a plurality of word lines 68, 168, and 268, connected electrically to the NROM cells 52. The bit lines 54, 154, and 254 connect with a column decoder 72, and the word lines 68, 168, and 268 connect with a row decoder 74. It is possible to choose one of the bit lines 54, 154, and 254 by the column decoder 72, and one of the word lines 68, 168, and 268 by the row decoder 74 to select one of the NROM cells 52. Before a NROM cell 52 is selected, a positive voltage of 2.1 V shall be applied to the drain 78 of the chosen NROM cell 52, and another positive voltage of 2.6 V shall be applied to the control gate 76 of the chosen NROM cell 52.

Each of the NROM cell 52 includes a control gate 76, connected with the word lines 68, 168, or 268, a drain 78 connected with a DC source 79, a source 82 connected with bit lines 54, 154, or 254, and a oxide-nitride-oxide (ONO) layer 84. Electrons can be injected into the ONO layer 84 of the memory cell 52, to increase the threshold voltage of the memory cell 52 and force the memory cell 52 to enter a state of writing. The NROM cell 52 outputs a memory current from the drain 78 to the source 82.

The reference cell 56 includes a transistor T, effectively the same as the NROM cell 52, connected with a DC bias of 1.6 V for turning on the transistor T as it outputs a reference current. The drain 78 is connected with the DC bias 79 of 2.1 V, and the ONO layer 84 injects electrons for increasing the threshold voltage of the transistor T, or in other words, decreasing the reference current the transistor T is able to output. The reference current flows from the drain 78 to the source 82. Furthermore, the reference current can be changed by adjusting the voltage of the control gate 76 of the transistor T. When the potential of the controls gate 76 decreases, the reference current decreases. The bit line 54 and the reference line 58 are connected with a parasitic capacitor 92 of the bit line 54. The parasitic capacitor 92 generates a voltage difference between the bit line 54 and the reference line 58 on the two input ends 64, and a result in the output end 66 to the ground.

The flash memory 50 further comprises an adjusting current 94, a test line 96 connected with the adjusting current 94 and the bit line 54 electrically, for inputting the adjusting current 94 to the sensing cell 62, a pair of switches 98 and 102 connected with the column decoder 72 and the adjusting current 94. At any one time, only one of the switches 98 and 102 is turned on, so it is impossible to generate the voltage drop on the capacitor 92 using the memory current while the adjusting current 94 is adjusted or by the adjusting current 94 via the test line 96 after completing an adjustment of the adjusting current 94. Sensing a difference between the bit line 54 and the reference line 58, that is larger than a predetermined voltage drop, during a predetermined time period, the adjusting current 94 can differentiate from the reference current. A connecting point for the test line 96 and the bit line 54 is located between the NROM cell 53, which is one of the NROM cells 52 and is nearest to the sensing cell 62, and the sensing cell 62.

Figure 2:
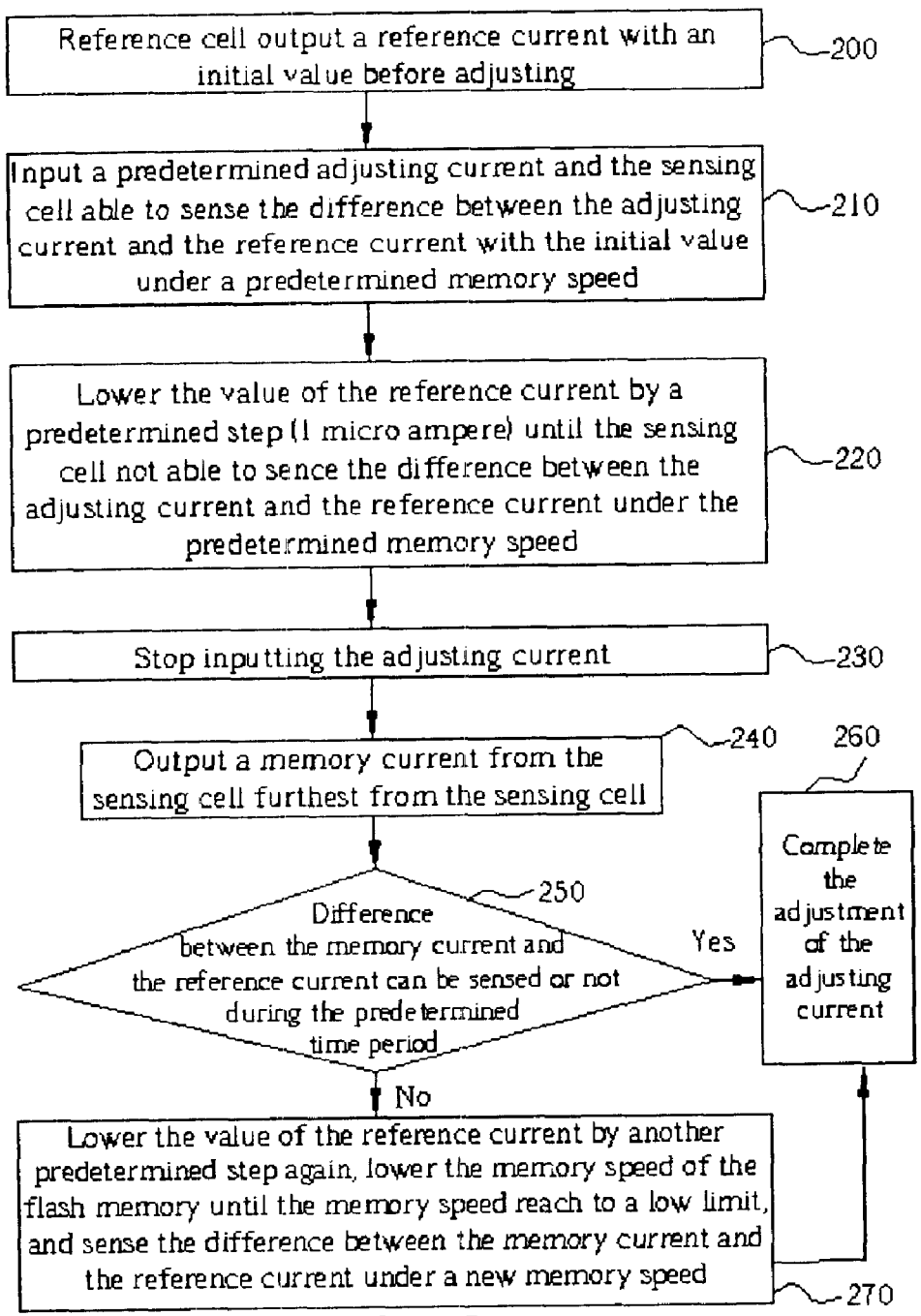
FIG. 2 is a flow chart for adjusting the reference current of the flash memory according to the present invention.

Please refer to FIG. 2 of a flow chart of the method for adjusting the reference current of the flash memory. The method comprises the following steps:

Step 200: Output the reference current with an initial value to the reference line 58 before adjustment.

Step 210: A predetermined adjusting current is inputted by the test line 96 and the sensing cell 62 is able to sense the difference between the reference current and the adjusting current under a predetermined memory speed.

Step 220: Lower a value of the reference current, which is equal to the initial value prior to being adjusted, by a predetermined step like 1 micro ampere until the sensing cell 62 is not able to sense the difference between the adjusting current and the reference current under the predetermined memory speed.

Step 230: Stop inputting the adjusting current.

Step 240: Select one of the NROM cells 52 furthest from the sensing cell 62 for outputting a memory current.

Step 250: Determine whether the difference between the memory current and the reference current, both are for being sensed, is in the predetermined time period or not, if yes, proceed to Step 260, if not, proceed to Step 270.

Step 260: Complete the adjustment of the adjusting current.

Step 270: Lower the value of the reference current by another predetermined step again, lower the memory speed of the flash memory 50 until the memory speed reaches a low limit, and sense the difference between the memory current and the reference current under a new memory speed.

After being manufactured but prior to adopting the adjusting method of the present invention, each flash memory has a low threshold voltage of 1.5 V. While the NROM cell is turned on, a current outputted by the NROM cell is effectively equal to the reference current with the initial value. The reference current with the initial value, of course, is a beginning point of the present invention while intending to adjust an appropriate reference current. The goal of the method according to the present invention is to adjust the adjusting current to an average of the reference current with the initial value and the drain current of the NROM cell while it has electrons injected continually and its corresponding threshold voltage is at the highest level, i.e. 2.5 V. As a result, it is possible to read the bit information stored in the NROM cell under the predetermined memory speed regardless of the condition of the flash memory no matter it is in reading or in writing state.

Before inputting the adjusting current 94, the NROM cells 52 should be disconnected from the bit line 54, 154, or 254 by turning their corresponding switch off. Therefore, the adjusting current 94 can be inputted to the test line 96 and the value of the adjusting current is two or three micro amperes larger than the value of the drain current while the NROM cell 52 with the highest threshold voltage.

While the threshold voltage of the NROM cell increases, the drain current of the NROM cell flowing to the reference line decreases. By injecting electrons to the ONO layer 84 of the NROM cell 52, a decreasing step for the NROM cell 52 with the increasing threshold voltage is about 1 micro ampere, which is also the decreasing step for the reference current. Every time the value of the reference current is decreased, the sensing cell 62 will be inputted voltage drops caused by the reference current and the adjusting current respectively, and the difference between the reference current and the adjusting current will be sensed again during a predetermined time period to determine until there is no way to sense the difference between the reference current and the adjusting current. The method will be repeated until the sensing cell 62 is unable to sense the difference between the reference current and the adjusting current under the predetermined memory speed.

Thereafter, one of the NROM cells 52 furthest from the sensing cell is turned on for outputting a memory current and the adjusting current is stopped to be inputted. If it is possible to sense the difference between the memory current outputted by the NROM cell 52 furthest from the sensing cell 62 and the reference current during the predetermined time period, the adjustment of the adjusting current is completed; if not, the value of the reference current will be lowered by another predetermined step and the memory speed will be lowered down also for allowing the newly adjusted reference current and the memory current to be sensed under the new memory speed. The memory speed of the flash memory ranges from 50 nano seconds to 150 nano seconds, meaning the memory speed, in this case, can not be less than 50 nano seconds eventhough it is always impossible to sense the memory current and the reference current under any memory speed between 50 nano seconds to 100 nano seconds.

Due to effects of capacitive loads of the NROM cells, the memory cell 52 furthest from the sensing cell 62 has the smallest memory current. If the smallest memory current can be sensed by the sensing cell 62 during the predetermined time period, other memory currents from other NROM cells 52 can no doubt be sensed during the predetermined time period.

Figure 3:
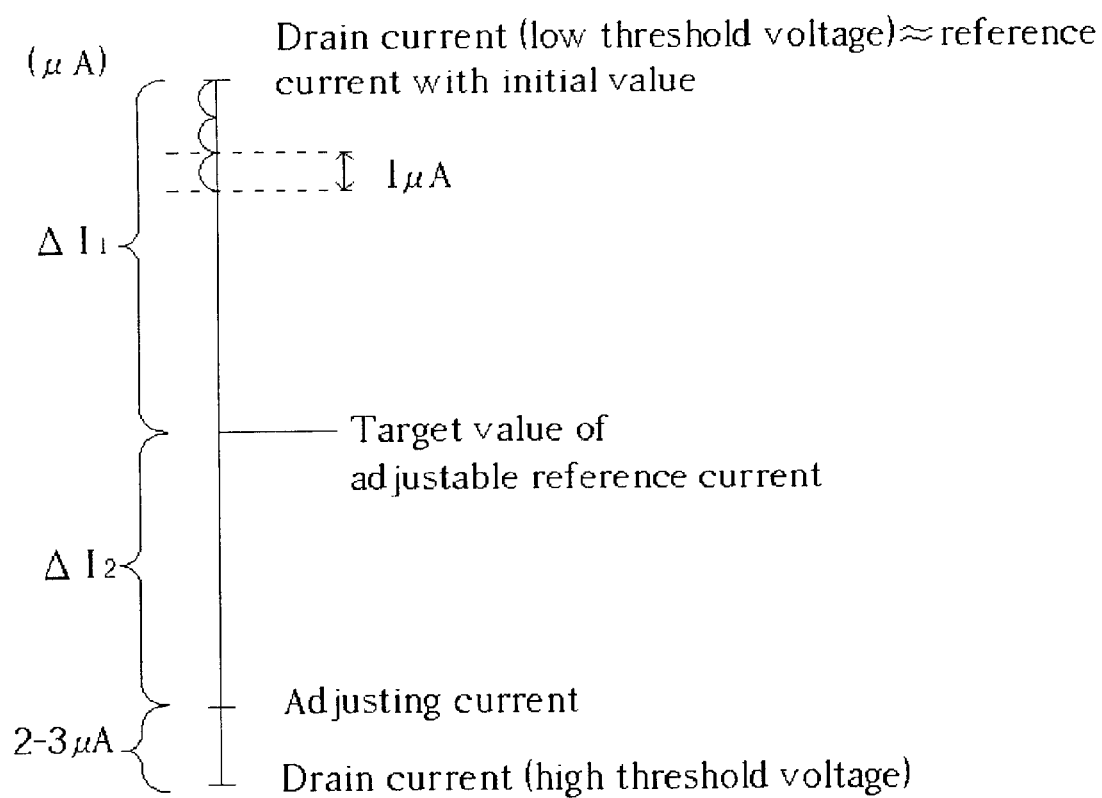
FIG. 3 is a schematic diagram for the value of the reference current during adjustment.

Please refer to FIG. 3 of a schematic diagram while the reference current is being adjusted. The drain current outputted by the NROM cell 52 while the NROM cell 52 has the lowest threshold voltage of 1.5 V is taken as the reference current with the initial value and the drain current outputted while it has the highest threshold voltage of 2.5 V is approximately equal to zero. Adding two or three micro amperes to the drain current while the NROM cell 52 has the highest threshold voltage is equal to the adjusting current required in the present invention. After that, the reference current can be adjusted by injecting electrons to the ONO layer 84 of the NROM cell 52 according to a one micro ampere decreasing step, or by adjusting the potential of the control gate 76. Each time the reference current is adjusted, the newly adjusted reference current and the adjusting current are outputted to the sensing cell 62 to make it possible to sense the difference between the newly adjusted reference current and the adjusting current in the predetermined time period. If it is possible to sense the difference during this time period, the adjustment of the reference current is complete; if it is not possible to do so, the method should be repeated until it is achieved.

A target value of the reference current, ideally, equals the mean of the drain current of highest threshold voltage and that of the lowest threshold voltage. The purpose of adding two or three micro amperes to the reference current with the highest threshold voltage is to achieve the value of the adjusting current in advance as to assure the method of the present invention therefore can be operated without any problems since there is room to lower the reference current two or three micro amperes furthermore as shown in FIG. 3.

In comparison with the prior art, the present invention only requires an additional reference transistor to adjust the required reference current and not only can read the bit information stored in the NROM cell accurately, but also can estimate the true memory speed of the flash memory while one or some NROM cells are not able to reach the current memory speed.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for adjusting a reference current for a flash memory, the flash memory comprising:

a plurality of nitride read only memory cells (NROM cells), operating under a predetermined memory speed with an output of each of the NROM cells connected with a bit line;

a reference cell, an output of the reference cell connected with a reference line, for outputting said reference current via the reference line, that is adjustable and has an initial value before it starts to be adjusted; and a sensing cell, including two input ends connected with the reference line and the bit line respectively, for sensing a current difference between the bit line and the reference line;

the method comprises:

inputting a predetermined adjusting current with a value less than that of the initial value of the reference current and the sensing cell, operated under the predetermined memory speed, sense a difference between the adjusting current and the reference current and show a result on the output end of the sensing cell; and lowering a value of the reference current at a predetermined rate and sensing the difference under the predetermined memory speed between the value of the reference current and the value of the adjusting current according to the output of the sensing cell until the output end of the sensing cell no longer show the difference between the adjusting current and the reference current under the predetermined memory speed.

2. The method of claim 1, prior to inputting the adjusting current, further comprises:

isolating the NROM cells connected with the bit line and inputting the adjusting current to the bit line via a test line.

3. The method of claim 2 wherein a connecting point for connecting the test line and the bit line is located proximate to the NROM cell nearest the sensing cell.

4. The method of claim 1 wherein the reference cell comprises a field effect transistor, including a control gate and an oxide-nitride-oxide (ONO) layer, for inputting the reference current to the reference line while the control gate is turned on.

5. The method of claim 4 wherein the electrons are injected into the ONO layer for increasing a threshold voltage of the field effect transistor to lower the value of the reference current passing through the field effect transistor while the control gate of the field effect transistor is turned on.

6. The method of claim 4 wherein a potential of the control gate decreases to lower the value of the reference current passing through the field effect transistor while the control gate of the field effect transistor is turned on.

7. The method of claim 1 wherein each of the NROM cells comprises a field effect transistor with a control gate and an ONO layer, and a threshold voltage of the transistor is set at a low threshold voltage prior to commencement of the method, and a current outputted by the bit line from each of the NROM cells is effectively the same as the initial value of the reference current.

8. The method of claim 7 wherein the threshold voltage of the field effect transistor of each of the NROM cells is to be adjusted to a high threshold voltage, allowing the current outputted from the NROM cell to be higher than a predetermined value for a high threshold current with the adjusting current larger than the high threshold current.

9. The method of claim 7 further comprising:
   stop inputting the adjusting current to the bit line;
   turning on the NROM cell furthest from the sensing cell for inputting a memory current to the bit line;
   sensing a difference between the memory current and the reference current by an output of the sensing cell under the predetermined memory speed;
   finish adjusting the reference current if the output of the sensing cell sense the difference between the memory current and the reference current under the predetermined memory speed;
   lowering the predetermined memory speed if there is no way to sense the difference between the memory current and the reference current under the predetermined memory speed and lowering the reference current outputted by the reference cell at said predetermined rate until the predetermined memory speed is adjusted to a low limit or the sensing cell sense the difference between the memory current and the reference current under a lowered predetermined memory speed.

10. The method of claim 1 wherein the predetermined memory speed ranges from 50 nano seconds to 150 nano seconds.

11. The method of claim 1 wherein the difference between the adjusting current and the reference current determines whether a voltage outputted from the sensing cell operated under the predetermined memory speed be sensed in a predetermined period or not, and the difference between the adjusting current and the reference current exists if the voltage outputted from the sensing cell in the predetermined period exceeds a predetermined voltage level.

12. The method of claim 1 wherein the sensing cell is a sensing amplifier.

13. A flash memory comprising:
   a plurality of NROM cells operated under a predetermined memory speed and an output end of each of the NROM cells connected with a bit line;
   a reference cell, an output of which is connected with a reference line, for outputting a reference current with a initial value before adjusting;
   a testing line with a connecting point located between the NROM cell nearest to the sensing cell and the sensing cell; and
   a sensing cell, with two input ends connected with the bit line and the reference line, for sensing a current difference between the bit line and the reference line;
   wherein the test line is able to be inputted an adjust current for adjusting the reference current of the reference cell.

14. The flash memory of claim 13 wherein the sensing cell is a sensing amplifier.

* * * * *